(12) United States Patent
Ihara et al.

(10) Patent No.: US 9,763,334 B2
(45) Date of Patent: Sep. 12, 2017

(54) SUSPENSION BOARD WITH CIRCUIT AND METHOD OF MANUFACTURING THE SAME

(71) Applicant: Nitto Denko Corporation, Ibaraki-shi, Osaka (JP)

(72) Inventors: Terukazu Ihara, Ibaraki (JP); Naohiro Terada, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 48 days.

(21) Appl. No.: 14/273,657

(22) Filed: May 9, 2014

(65) Prior Publication Data

US 2014/0345920 A1    Nov. 27, 2014

(30) Foreign Application Priority Data

May 22, 2013  (JP) .................................. 2013-107829

(51) Int. Cl.
*H05K 1/00* (2006.01)
*H05K 1/09* (2006.01)
(Continued)

(52) U.S. Cl.
CPC .......... *H05K 3/3405* (2013.01); *G11B 5/4853* (2013.01); *H05K 2201/09427* (2013.01);
(Continued)

(58) Field of Classification Search
CPC ..... G11B 5/4853; G11B 5/486; G11B 5/4833; G11B 5/4873; G11B 5/48; G11B 21/16; H05K 2201/10909; H05K 3/3405
See application file for complete search history.

(56) References Cited

U.S. PATENT DOCUMENTS 5,041,901 A * 8/1991 Kitano ............. H01L 23/49582
257/669
5,061,552 A * 10/1991 Satou .................. H01L 21/4853
257/E23.069
(Continued)

FOREIGN PATENT DOCUMENTS

JP        H11167944 A    6/1999
JP        2012-119032 A  6/2012
(Continued)

OTHER PUBLICATIONS

Office Action issued Dec. 13, 2016 in JP Application No. 2013-107829.

*Primary Examiner* — Chau N Nguyen
*Assistant Examiner* — Roshn Varghese
(74) *Attorney, Agent, or Firm* — Panitch Schwarze Belisario & Nadel LLP

(57) ABSTRACT

Heat-assisted wiring traces and a conductive support substrate are respectively formed on first and second surfaces of an insulating layer. Further, connection terminals electrically insulated from the support substrate and electrically respectively connected to the heat-assisted wiring traces are formed on the second surface of the insulating layer. Each connection terminal has an element connection portion, a pattern connection portion and a spread blocking portion. When a circuit element is connected to the element connection portion of the connection terminal by solder, spreading of a molten solder applied to the element connection portion to the pattern connection portion is blocked by the spread blocking portion.

16 Claims, 13 Drawing Sheets

(51) Int. Cl.
*H05K 1/03* (2006.01)
*G11B 5/48* (2006.01)
*G11B 21/16* (2006.01)
*H05K 3/34* (2006.01)

(52) U.S. Cl.
CPC .............. *H05K 2201/09727* (2013.01); *H05K 2203/046* (2013.01); *Y10T 29/49147* (2015.01)

(56) References Cited

U.S. PATENT DOCUMENTS

| | | | | |
|---|---|---|---|---|
| 5,194,137 | A * | 3/1993 | Moore | B23K 1/0016 205/125 |
| 6,300,678 | B1 * | 10/2001 | Suehiro | H01L 21/4853 257/667 |
| 6,399,899 | B1 * | 6/2002 | Ohkawa | H01R 13/58 174/255 |
| 6,485,843 | B1 * | 11/2002 | Eslamy | H01L 23/49811 257/779 |
| 6,841,737 | B2 * | 1/2005 | Komatsubara | G11B 5/4853 174/250 |
| 2004/0246626 | A1 * | 12/2004 | Wakaki | G11B 5/486 360/245.8 |
| 2007/0102490 | A1 * | 5/2007 | Momokawa | H05K 1/0201 228/101 |
| 2011/0111264 | A1 * | 5/2011 | Hanazono | H01M 8/0269 174/262 |
| 2012/0006586 | A1 * | 1/2012 | Ohnuki | H05K 1/05 174/257 |
| 2012/0014017 | A1 * | 1/2012 | Ohnuki | G11B 5/4833 174/261 |
| 2012/0092794 | A1 * | 4/2012 | Ohsawa | G11B 5/486 360/246.2 |
| 2012/0113547 | A1 * | 5/2012 | Sugimoto | G11B 5/486 360/245.8 |
| 2012/0134056 | A1 | 5/2012 | Yamada | |
| 2013/0342936 | A1 | 12/2013 | Nishiyama et al. | |

FOREIGN PATENT DOCUMENTS

| | | |
|---|---|---|
| JP | 2012190493 A | 10/2012 |
| JP | 2012238357 A | 12/2012 |

* cited by examiner

SUSPENSION BOARD WITH CIRCUIT AND METHOD OF MANUFACTURING THE SAME

BACKGROUND OF THE INVENTION

Field of the Invention

The present invention relates to a suspension board with a circuit and a method of manufacturing the same.

Description of Related Art

Actuators are used in drives such as hard disc drives. Such an actuator includes an arm provided rotatably around a rotation shaft, and a suspension board with a circuit for a magnetic head that is attached to the arm. The suspension board with a circuit is a printed circuit board for positioning the magnetic head at a desired track of a magnetic disc.

Generally, in the suspension board with a circuit, a wiring and a connection terminal are formed at one surface and a metal substrate is formed at another surface, of an insulating layer. In a suspension described in JP 2012-119032 A, a plurality of conductors and a plurality of connection terminals are formed at the upper surface of the insulating layer, and a metal base is formed at the lower surface of the insulating layer. An electrical circuit portion that is electrically independent from the metal base is formed at the lower surface of the insulating layer as the connection terminal. End portions of part of the plurality of conductors are connected to the electrical circuit portion via a conductor coupling portion that penetrates the insulating layer.

BRIEF SUMMARY OF THE INVENTION

In recent years, various types of suspension boards with a circuit at which the plurality of connection terminals are formed at both surfaces of the insulating layer have been developed as the suspension described in JP 2012-119032 A. Further, the connection of an element to the connection terminal is generally performed using solder. In a case in which the element is connected to the connection terminal at the lower surface of the insulating layer using solder, however, a short circuit is likely to occur between the adjacent connection terminals at the lower surface of the insulating layer, or between the connection terminals at both surfaces of the insulating layer due to wetting and spreading of molten solder.

In this manner, if the wetting and spreading of the molten solder to an unintended portion occurs in the suspension board with a circuit at which the connection terminals are formed at the both surfaces of the insulating layer, a deficiency such as a short circuit of the wiring is likely to occur. As a result, reliability of the suspension board with a circuit is reduced.

An object of the present invention is to provide a suspension board with a circuit in which a decrease in reliability due to wetting and spreading of molten solder can be inhibited, and a manufacturing method of the suspension board with a circuit.

1) According to one aspect of the present invention, a suspension board with a circuit to which a circuit element is connected by solder includes an insulating layer having first and second surfaces, a conductor layer formed on the first surface of the insulating layer, a conductive support substrate formed on the second surface of the insulating layer, and a connection terminal formed on the second surface of the insulating layer, electrically insulated from the support substrate and electrically connected to the conductor layer, wherein the connection terminal has first and second portions, and a spread blocking portion that blocks spreading of the solder applied to the first portion to the second portion.

In this suspension board with a circuit, the conductor layer and the conductive support substrate are respectively formed on the first and second surfaces of the insulating layer. Further, the connection terminal electrically insulated from the support substrate and electrically connected to the conductor layer is formed on the second surface of the insulating layer. The connection terminal has the first and second portions and the spread blocking portion.

This configuration causes the spreading of the molten solder applied to the first portion to the second portion to be blocked by the spread blocking portion in a case in which the circuit element is connected to the first portion of the connection terminal by solder. Thus, the second portion is prevented from electrically coming into contact with another unintended portion via solder. As a result, a decrease in reliability of the suspension board with a circuit due to the wetting and spreading of the molten solder can be inhibited.

(2) The spread blocking portion may be a surface treatment layer formed on a surface of the first portion, and a material of the surface treatment layer may have a higher wettability than a material for a surface of the second portion with respect to molten solder.

In this case, the molten solder applied to the surface treatment layer on the first portion of the connection terminal is difficult to spread at a boundary between the surface treatment layer and the second portion after rapidly spreading on the surface treatment layer. Thus, the molten solder is cooled by the natural radiation of heat, and is solidified before spreading to the second portion. As a result, the wetting and spreading of the molten solder can be blocked by the simple configuration.

(3) The first and second portions may be formed of a stainless steel, and the surface treatment layer may be formed by gold plating. In this case, the wetting and spreading of the molten solder at a boundary between the surface treatment layer and the second portion can be sufficiently blocked.

(4) The connection terminal may have a width changing portion in which a width changes between the first portion and the second portion, and the spread blocking portion may be the width changing portion.

In this case, the molten solder applied to the first portion of the connection terminal is cooled by the natural radiation of heat in passing through the width changing portion, and is solidified before spreading to the second portion. Thus, the wetting and spreading of the molten solder can be blocked by the simple configuration.

(5) The width changing portion may have a narrow portion that has a width smaller than width of the first portion and width of the second portion.

In this case, because the width of the narrow portion is smaller than the width of the first portion and the width of the second portion, the spreading rate of the molten solder on the narrow portion is lower than the spreading rate of the molten solder on the first portion. Therefore, the molten solder applied to the first portion of the connection terminal remains around the narrow portion. Thus, the molten solder is cooled by the natural radiation of heat, and is solidified before spreading to the second portion. Further, even if the molten solder spreads to the second portion, because the width of the second portion is larger than the width of the width changing portion, the molten solder is solidified before spreading outside of the second portion. As a result, the wetting and spreading of the molten solder can be blocked by the simple configuration.

(6) The first portion may be made of a wide portion that has a width larger than width of the second portion, and the width changing portion may be a boundary between the wide portion and the second portion.

In this case, because the width of the wide portion is larger than the width of the second portion, the thermal dissipation of the wide portion is higher than the thermal dissipation of the second portion. Therefore, the molten solder applied to the first portion of the connection terminal is cooled by the natural radiation of heat, and is solidified before spreading to the second portion. As a result, the wetting and spreading of the molten solder can be blocked by the simple configuration.

(7) The connection terminal may have a thickness changing portion in which a thickness changes between the first portion and the second portion, and the spread blocking portion may be the thickness changing portion.

In this case, the molten solder applied to the first portion of the connection terminal is cooled by the natural radiation of heat in passing through the thickness changing portion, and is solidified before spreading to the second portion. Thus, the wetting and spreading of the molten solder can be blocked by the simple configuration.

(8) The first portion may have a thickness larger than the second portion, and the thickness changing portion may be a boundary between the first portion and the second portion.

In this case, the molten solder applied to the first portion of the connection terminal is cooled by the natural radiation of heat in spreading downward along the edge of the first portion after spreading on the first portion, and is solidified before spreading to the second portion. Thus, the wetting and spreading of the molten solder can be blocked by the simple configuration.

(9) The second portion may have a thickness larger than the first portion, and the thickness changing portion may be a boundary between the first portion and the second portion.

In this case, the molten solder applied to the first portion of the connection terminal is blocked by the edge of the second portion after spreading on the first portion. Alternatively, the molten solder applied to the first portion of the connection terminal is cooled by the natural radiation of heat in spreading upward along the edge of the second portion. Thus, the molten solder is solidified before spreading to the second portion. As a result, the wetting and spreading of the molten solder can be blocked by the simple configuration.

(10) The thickness changing portion may be a projection provided along a boundary between the first portion and the second portion, and the projection may be formed to project from surfaces of the first and second portions.

In this case, the molten solder applied to the first portion of the connection terminal is blocked by the projection after spreading on the first portion. Alternatively, the molten solder applied to the first portion of the connection terminal is cooled by the natural radiation of heat in spreading upward along the edge of the projection. Thus, the molten solder is solidified before spreading to the second portion. As a result, the wetting and spreading of the molten solder can be blocked by the simple configuration.

(11) The projection may be formed of resin. In this case, the projection can be easily formed on the surface between the first portion and the second portion of the connection terminal.

(12) The projection may be formed of metal. In this case, the thermal dissipation at the projection is improved. Thus, the wetting and spreading of the molten solder can be blocked by the simple configuration.

(13) According to another aspect of the present invention, a method of manufacturing a suspension board with a circuit to which a circuit element is connected by solder includes the steps of preparing a structure that includes an insulating layer having first and second surfaces, a conductor layer formed on the first surface of the insulating layer and a conductive support layer formed on the second surface of the insulating layer, forming a conductive support substrate on the second surface of the insulating layer by processing the support layer, and forming a connection terminal, being electrically insulated from the support substrate and electrically connected to the conductor layer, on the second surface of the insulating layer by processing the support layer, wherein the connection terminal has first and second portions, and a spread blocking portion that blocks spreading of the solder applied to the first portion to the second portion.

In this method of manufacturing the suspension board with a circuit, the conductor layer and the conductive support layer are respectively formed on the first and second surfaces of the insulating layer. The support layer is processed, whereby the conductive support layer is formed on the second surface of the insulating layer, and the connection terminal electrically insulated from the support substrate and electrically connected to the conductor layer is formed. The connection terminal has the first portion, the second portion and the spread blocking portion.

This configuration causes the spreading of the molten solder applied to the first portion to the second portion to be blocked by the spread blocking portion in a case in which the circuit element is connected to the first portion of the connection terminal by solder. Thus, the second portion is prevented from electrically coming into contact with another unintended portion via solder. As a result, a decrease in reliability of the suspension board with a circuit due to the wetting and spreading of the molten solder can be inhibited.

Other features, elements, characteristics, and advantages of the present invention will become more apparent from the following description of preferred embodiments of the present invention with reference to the attached drawings.

DESCRIPTION OF THE PREFERRED EMBODIMENTS

[1] First Embodiment

A printed circuit board and a method of manufacturing the printed circuit board according to the first embodiment of the present invention will be described below with reference to diagrams. A suspension board used for an actuator of a hard disc drive will be described as the printed circuit board according to the first embodiment of the present invention.

(1) Configuration of Suspension Board

Figure 1:
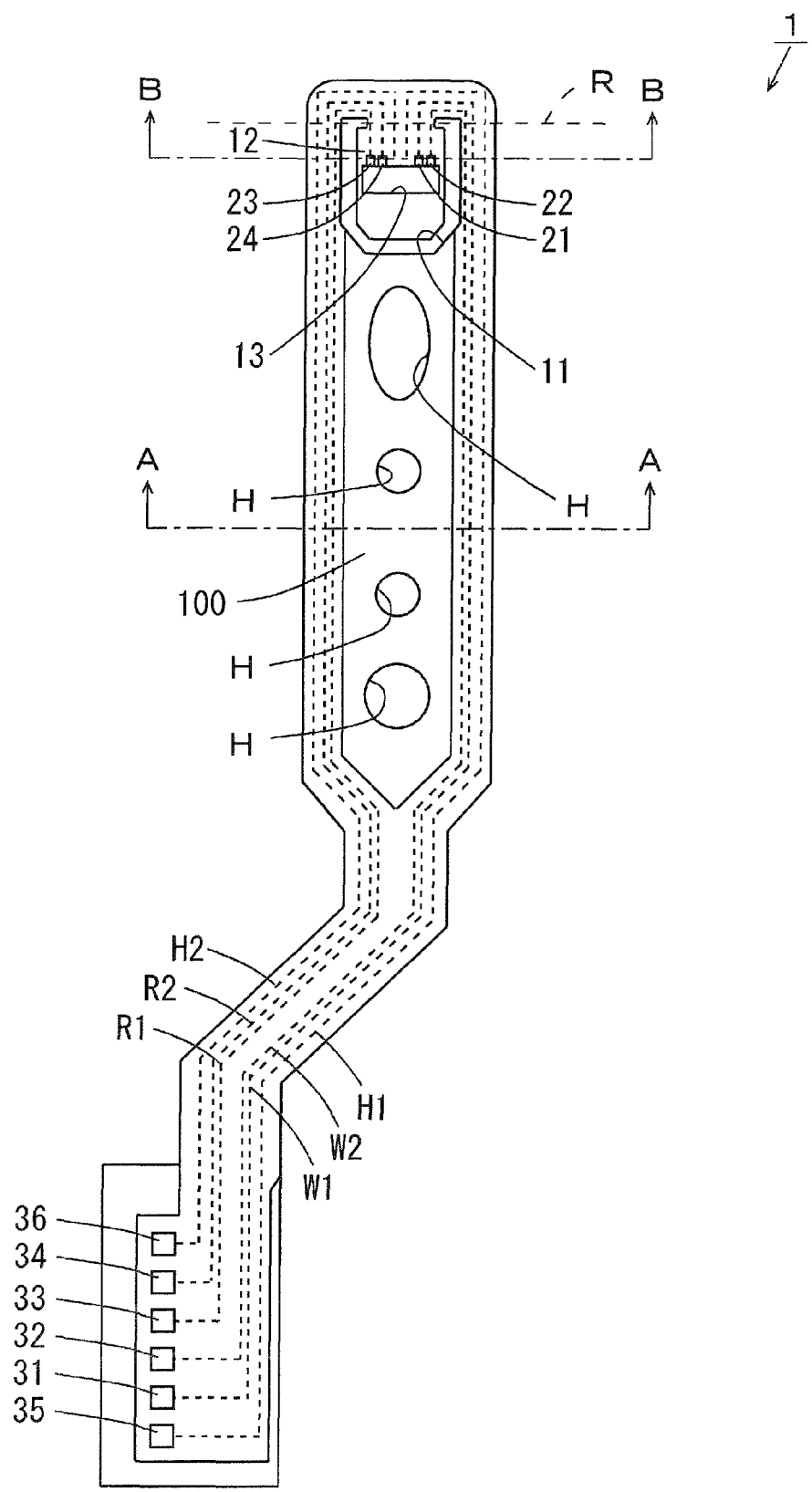
FIG. 1 is a top view of a suspension board according to a first embodiment of the present invention.

FIG. 1 is a top view of the suspension board according to the first embodiment of the present invention. As shown in FIG. 1, the suspension board 1 includes a suspension body 100 formed of a metallic long-sized support substrate. As indicated by the dotted lines, write wiring traces W1, W2, the read wiring traces R1, R2 and heat-assisted wiring traces H1, H2 are formed at the upper surface of the suspension body 100.

At the tip end of the suspension body 100, a magnetic head supporting portion (hereinafter referred to as a tongue) 12 is provided by forming a U-shaped opening 11. The tongue 12 is bent along the broken line R to form a predetermined angle with respect to the suspension body 100. A rectangular opening 13 is formed at the tongue 12.

Four connection terminals 21, 22, 23, 24 are formed at the upper surface of the tongue 12 at the one end of the suspension body 100. Further, two connection terminals 25, 26 (see below-mentioned FIGS. 2(a) and 2(b)) are formed at the lower surface of the tongue 12 at the one end of the suspension body 100. In FIG. 1, the connection terminals 25, 26 at the lower surface of the tongue 12 are not shown.

In the present embodiment, a head slider (not shown) has a magnetic head at the upper surface thereof. A heat-assisted device such as a laser diode is attached to the lower surface of the head slider. A magnetic disc is heated by the heat-assisted device at the time of writing the information into the magnetic disc by the magnetic head. Thus, the density of information written into the magnetic disc can be improved.

The head slider is inserted into the opening 13 of the tongue 12. Thus, the terminals of the magnetic head at the upper surface of the head slider are connected to the connection terminals 21 to 24 at the upper surface of the tongue 12, and the terminals of the heat-assisted device at the lower surface of the head slider are connected to each of the connection terminals 25, 26 at the lower surface of the tongue 12. In the present embodiment, each of the connection terminals 21 to 26 is rectangular.

Six connection terminals 31, 32, 33, 34, 35, 36 are formed at the upper surface at the other end of the suspension body 100. An electric circuit such as a preamplifier is connected to each of the connection terminals 31 to 34. A power supply circuit for the heat-assisted device is connected to each of the connection terminals 35, 36. The connection terminals 21 to 26 of the tongue 12 and the connection terminals 31 to 36 at the other end of the suspension body 100 are respectively electrically connected through the write wiring traces W1, W2, the read wiring traces R1, R2 and the heat-assisted wiring traces H1, H2. Further, a plurality of holes H are formed at the suspension body 100.

The suspension board 1 is provided at the hard disc device. An electric current flows in the pair of write wiring traces W1, W2 at the time of writing information into the magnetic disc. The write wiring trace W1 and the write wiring trace W2 constitute a differential signal line pair that transmits a differential write signal. Further, an electric current flows in the pair of read wiring traces R1, R2 at the time of reading information from the magnetic disc. The read wiring trace R1 and the read wiring trace R2 constitute a differential signal line pair that transmits a differential read signal.

(2) Configuration of Connection Terminals

Next, details of the connection terminals 21 to 26 of the suspension board 1 and their peripheral portions will be described. FIGS. 2(a) and 2(b) are cross sectional views of the suspension board 1 of FIG. 1. FIG. 2(a) shows a cross sectional view taken along the line A-A of the suspension board 1 of FIG. 1, and FIG. 2(b) shows a cross sectional view taken along the line B-B of the suspension board 1 of FIG. 1.

As shown in FIG. 2(a), an insulating layer 41 made of polyimide, for example, is formed on the metallic support substrate 10 made of a stainless steel, for example. The write wiring traces W1, W2, the read wiring traces R1, R2 and the heat-assisted wiring traces H1, H2 are formed on the insulating layer 41 in parallel with each other at intervals.

The write wiring traces W1, W2 and the heat-assisted wiring trace H1 extend along one lateral side of the insulating layer 41. The heat-assisted wiring trace H1 is arranged outside of the write wiring traces W1, W2. The read wiring traces R1, R2 and the heat-assisted wiring trace 1-12 extend along the other lateral side of the insulating layer 41. The heat-assisted wiring trace H2 is arranged outside of the read wiring traces R1, R2.

A coating layer 43 made of polyimide, for example, is formed on the insulating layer 41 to cover the write wiring traces W1, W2, the read wiring traces R1, R2 and the heat-assisted wiring traces H1, H2. The connection terminals 21 to 24 are exposed from the coating layer 43.

The write wiring traces W1, W2 and the heat-assisted wiring trace H1 that extend along the one lateral side of the insulating layer 41 are bent inward at the one end of the suspension body 100 of FIG. 1, and are further bent toward the tongue 12 and extends to the tongue 12. Similarly, the read wiring traces R1, R2 and the heat-assisted wiring trace H2 that extend along the other lateral side of the insulating layer 41 are bent inward at the one end of the suspension body 100, are further bent toward the tongue 12 and extend to the tongue 12.

Figure 2:
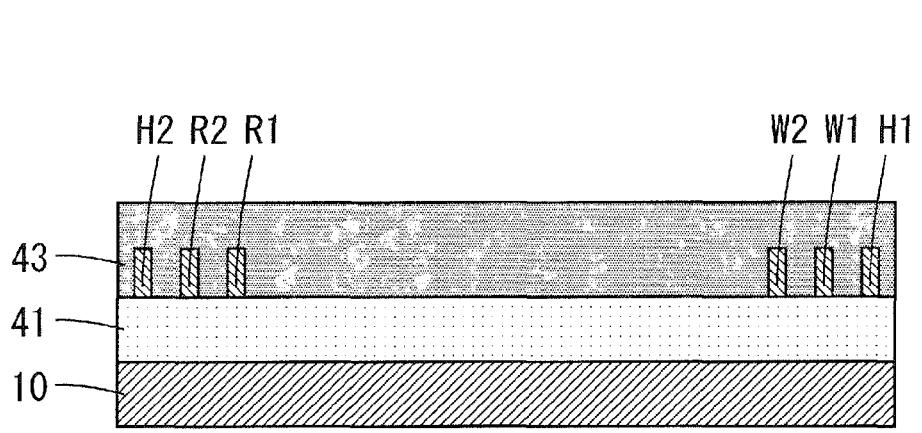
FIGS. 2(a) and 2(b) are cross sectional views of the suspension board of FIG. 1.
Figure 2:
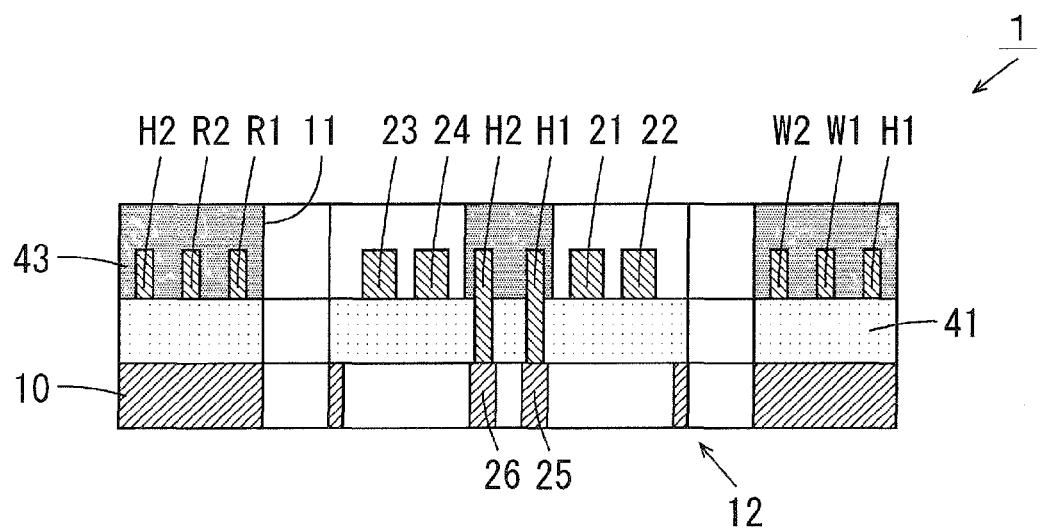

The write wiring traces W1, W2 and the read wiring traces R1, R2 on the tongue 12 are respectively connected to the connection terminals 21 to 24 at the upper surface of the tongue 12. The heat-assisted wiring traces H1, H2 on the tongue 12 are respectively connected to the connection terminals 25, 26 at the lower surface of the tongue 12 by penetrating the insulating layer 41, as shown in FIG. 2(*b*). The surfaces of the connection terminals 25, 26 are exposed at the lower surface of the insulating layer 41.

Figure 3:
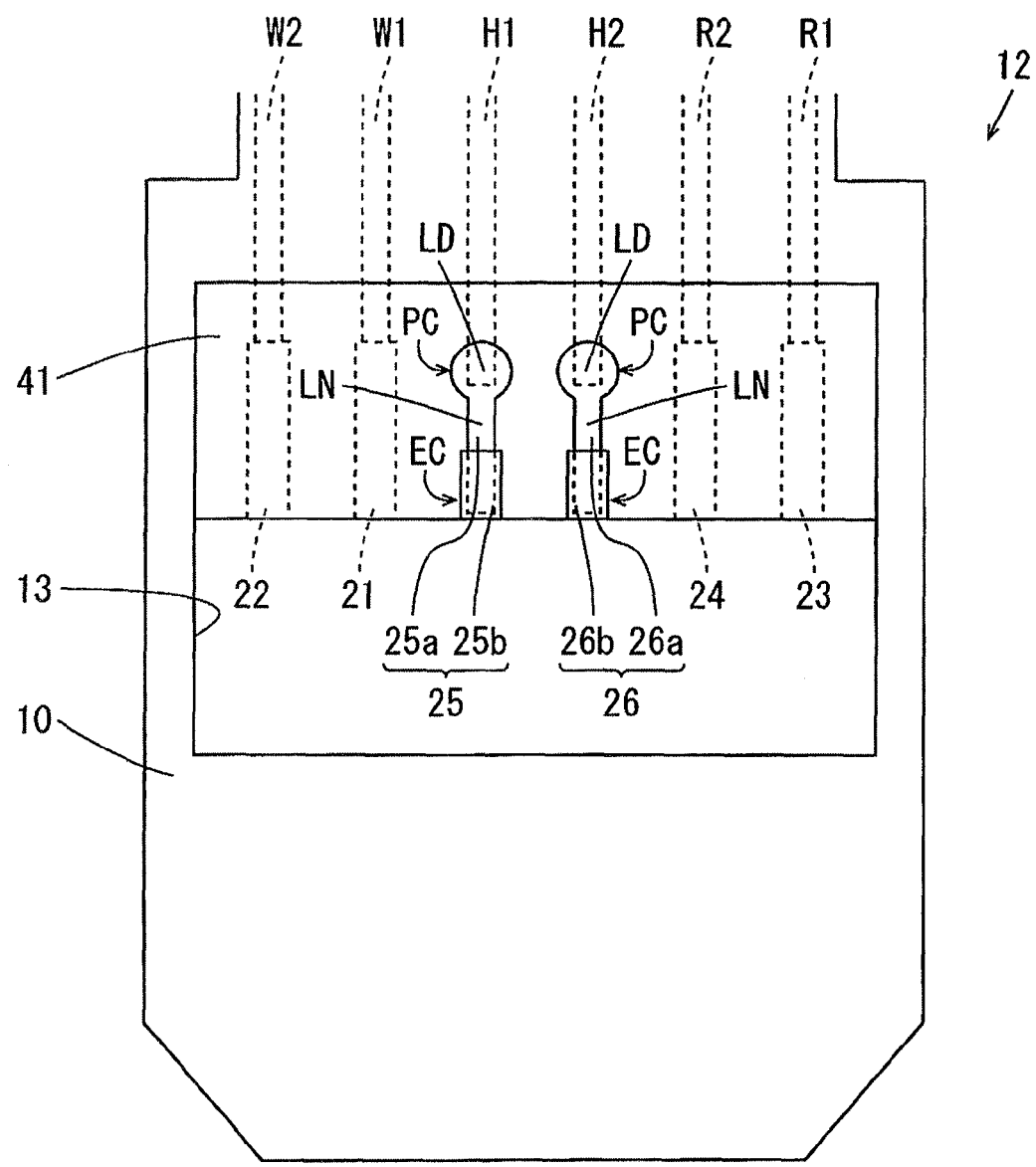
FIG. 3 is a bottom view of a tongue of the suspension board of FIG. 1 and its peripheral portions.

Details of the connection terminals 25, 26 will be described. FIG. 3 is a bottom view of the tongue 12 of the suspension board 1 of FIG. 1 and its peripheral portions. As shown in FIG. 3, the connection terminals 25, 26 are arranged at the lower surface of the tongue 12 to extend in one direction. Each of the connection terminals 25, 26 is made of a land portion LD and a straight line portion LN. A pattern connection portion PC is formed at each of the land portions LD of the connection terminals 25, 26, and an element connection portion EC is formed at the end of each of the straight line portions LN opposite to the land portion LD.

The heat-assisted wiring traces H1, H2 at the upper surface of the tongue 12 are respectively connected to the pattern connection portions PC of the connection terminals 25, 26. In the example of FIG. 3, the pattern connection portions PC of the connection terminals 25, 26 are formed to be wider than the remaining portions of the connection terminals 25, 26 such that the pattern connection portions PC can be easily connected to the heat-assisted wiring traces H1, H2. Therefore, a distance between the pattern connection portions PC of the connection terminals 25, 26 is smaller than a distance between the remaining portions of the connection terminals 25, 26. The terminals of the heat-assisted device of the head slider are connected to the element connection portions EC of the connection terminals 25, 26 by solder. Here, the material of the solder mainly includes tin (Sn), silver (Ag) and copper (Cu).

Specifically, the connection terminal 25 includes an insular portion 25*a* and a metal layer 25*b*, and the connection terminal 26 includes an insular portion 26*a* and a metal layer 26*b*. The metal layers 25*b*, 26*b* are formed of a member in which the wetting and spreading of molten solder are more likely to occur than the insular portions 25*a*, 26*a*. For example, the insular portions 25*a*, 26*a* are formed of a stainless steel (SST), and the metal layers 25*b*, 26*b* are formed of gold (Au).

The insular portions 25*a*, 26*a* are arranged at the lower surface of the tongue 12 to extend in one direction. In the present embodiment, the metal layers 25*b*, 26*b* are formed to respectively cover the other ends of the insular portions 25*a*, 26*a*. In this configuration, the one ends of the insular portions 25*a*, 26*a* are the pattern connection portions PC, and the other ends of the insular portions 25*a*, 26*a* are the element connection portions EC.

(3) Manufacturing Method of Suspension Board

Figure 4:
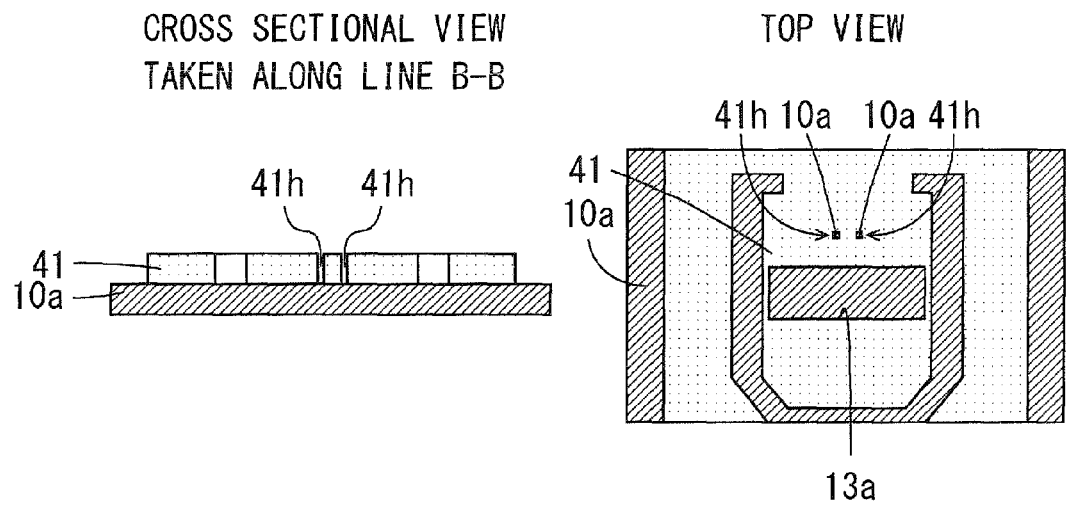
FIGS. 4(a) to 4(c) are schematic diagrams showing manufacturing steps of the suspension board of FIG. 1.
Figure 4:
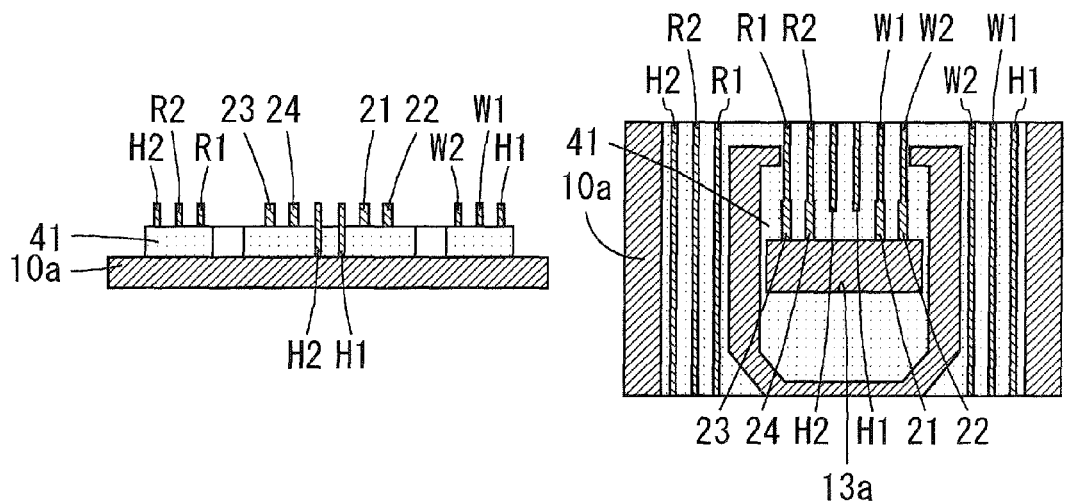
Figure 4:
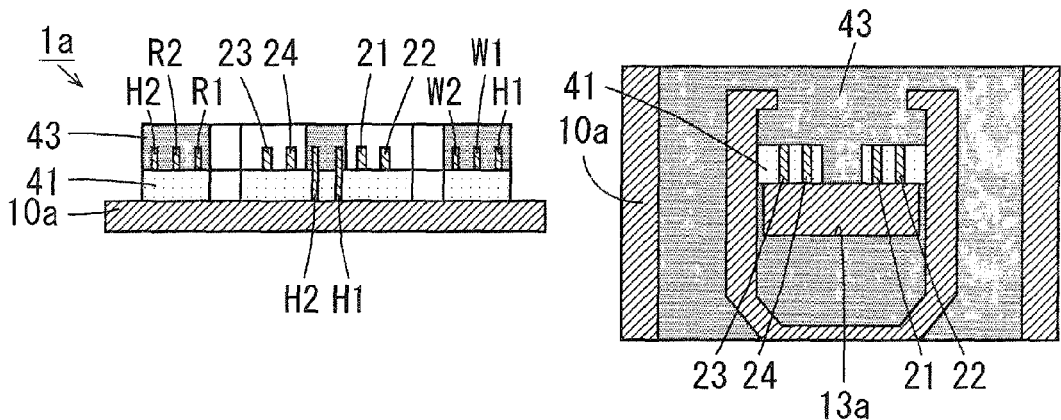
Figure 5:
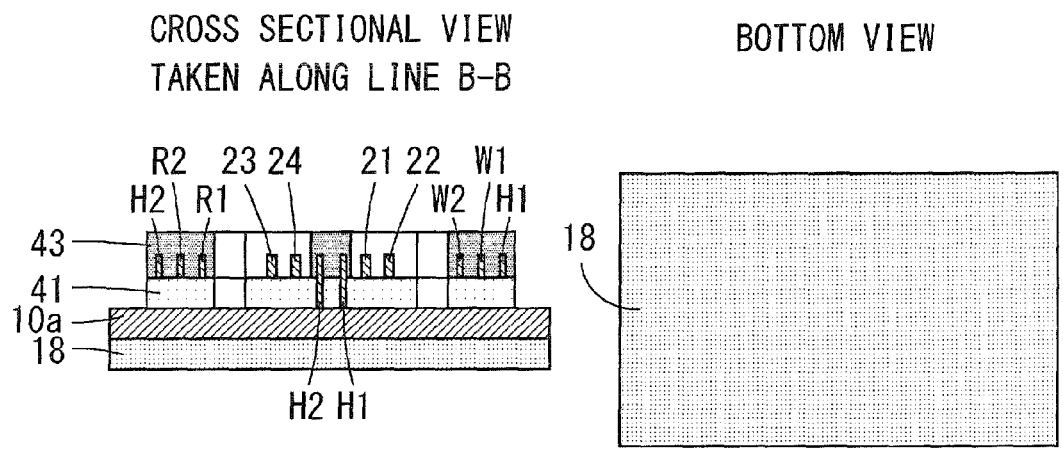
FIGS. 5(a) to 5(c) are schematic diagrams showing the manufacturing steps of the suspension board of FIG. 1.
Figure 5:
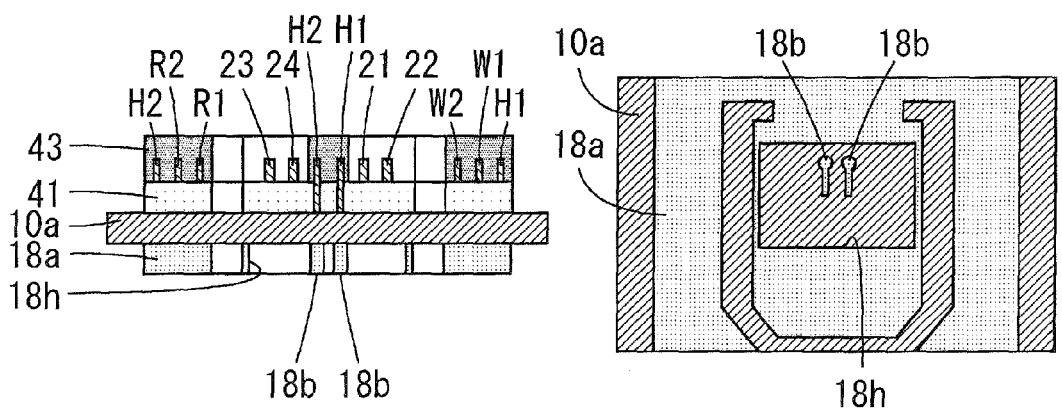
Figure 5:
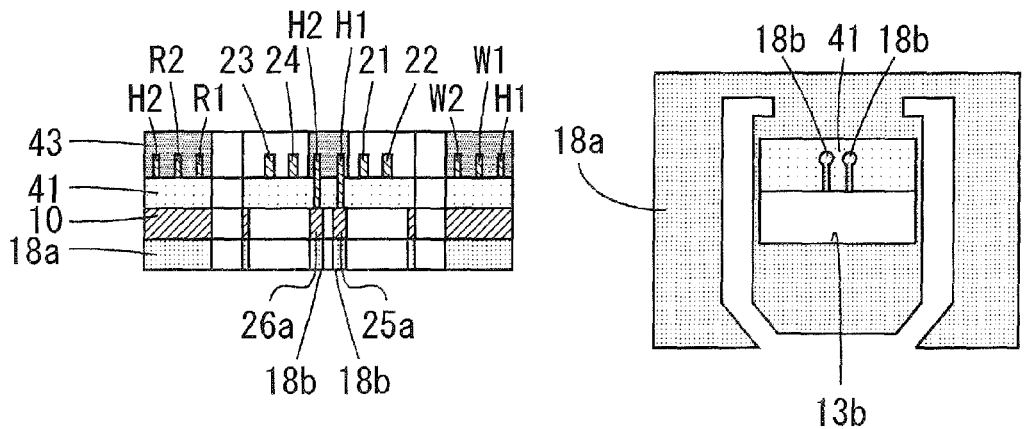

The manufacturing method of the suspension board 1 will be described below. FIGS. 4(*a*) to 6(*b*) are schematic diagrams showing the manufacturing steps of the suspension board 1 of FIG. 1. In FIGS. 4(*a*) to 4(*c*), cross sectional views taken along the line B-B of the suspension board 1 of FIG. 1 are shown in the left, and top views of the tongue 12 of the suspension board 1 and its peripheral portions are shown in the right. In FIGS. 5(*a*) to 6(*b*), cross sectional views taken along the line B-B of the suspension board 1 of FIG. 1 are shown in the left, and bottom views of the tongue 12 of the suspension board 1 of FIG. 1 and its peripheral portions are shown in the right. The same hatched and dotted patterns applied to each member of the cross sectional views are applied to the members of the top views of FIGS. 4(*a*) to 4(*c*) and the bottom views of FIGS. 5(*a*) to 6(*b*) in order to facilitate understanding of the configuration.

First, as shown in FIG. 4(*a*), the insulating layer 41 made of polyimide is formed on a support layer 10*a* made of a stainless steel. The support layer 10*a* has a thickness of not less than 10 µm and not more than 50 µm, for example. The insulating layer 41 has a thickness of not less than 5 µm and not more than 15 µm, for example. Here, the insulating layer 41 is formed in the same shape as the shape of the suspension board 1 of FIG. 1. Further, a rectangular opening 13*a* and a plurality of (two in the example of FIG. 4(*a*)) openings 41*h* are formed at the insulating layer 41. Thus, part of the support layer 10*a* is exposed from the opening 13*a* and the plurality of openings 41*h*.

Next, as shown in FIG. 4(*b*), the write wiring traces W1, W2, the read wiring traces R1, R2 and the heat-assisted wiring traces H1, H2 having predetermined patterns are formed on the insulating layer 41 and at the support layer 10*a* exposed from the openings 41*h*. Simultaneously, the connection terminals 21 to 24 are respectively formed at the ends of the write wiring traces W1, W2 and the read wiring traces R1, R2.

The write wiring traces W1, W2, the read wiring traces R1, R2 and the heat-assisted wiring traces H1, H2 are made of copper, for example. In the present example, nickel plating and gold plating are respectively sequentially performed on the write wiring traces W1, W2 and the read wiring traces R1, R2, whereby the connection terminals 21 to 24 are formed.

The write wiring traces W1, W2, the read wiring traces R1, R2 and the heat-assisted wiring traces H1, H2 have a thickness of not less than 6 µm and not more than 18 µm, for example. Further, the write wiring traces W1, W2, the read wiring traces R1, R2 and the heat-assisted traces H1, H2 have a width of not less than 8 µm and not more than 50 µm, for example.

Further, a distance between the write wiring traces W1, W2 and a distance between read wiring traces R1, R2 are respectively not less than 8 µm and not more than 100 µm, for example. Similarly, a distance between the write wiring trace W1 and the heat-assisted wiring trace H1, and a distance between the read wiring trace R2 and the heat-assisted wiring trace H2 are respectively not less than 8 µm and not more than 100 µm, for example.

Subsequently, as shown in FIG. 4(*c*), a coating layer 43 made of polyimide is formed on the insulating layer 41 to cover the write wiring traces W1, W2, the read wiring traces R1, R2 and the heat-assisted wiring traces H1, H2. The coating layer 43 has a thickness of not less than 2 µm and not more than 10 µm, for example. The connection terminals 21 to 24 are exposed from the coating layer 43.

Thus, a structure 1*a* is completed. In the structure 1*a*, the write wiring traces W1, W2, the read wiring traces R1, R2, the heat-assisted wiring traces H1, H2, the connection terminals 21 to 24 and the coating layer 43 are formed on the one surface of the insulating layer 41. Further, the support layer 10*a* is formed on the other surface of the insulating layer 41.

Next, as shown in FIG. 5(*a*), a resist film 18 is formed at the lower surface of the support layer 10*a* of the structure 1*a* using a photosensitive dry film resist or the like, for example. Subsequently, as shown in FIG. 5(*b*), the resist film 18 is developed using a development liquid such as sodium carbonate after the resist film 18 is exposed in a predetermined pattern, whereby etching resists 18*a*, 18*b* are formed.

Here, the etching resist 18*a* is formed in a region of the support layer 10*a* that overlaps with the coating layer 43 of FIG. 4(*c*). Further, the etching resist 18*a* has a rectangular opening 18h that surrounds the openings 41h of the insulating layer 41 of FIG. 4(a) and the opening 13a of FIG. 4(c).

Further, the etching resists 18b are formed to overlap with the openings 41h of the insulating layer 41 and extend in one direction in the opening 18h of the etching resist 18a. The width of the one ends of the etching resists 18b is formed to be larger than the width of the remaining portions of the etching resists 18b.

Thereafter, as shown in FIG. 5(c), the support layer 10a is etched using a ferric chloride solution and a cupric chloride solution as an etching solution. Thus, portions of the support layer 10a exposed from the etching resists 18a, 18b are removed. Thus, the support substrate 10 is formed.

Here, a rectangular opening 13b is formed at the support substrate 10 to communicate with the opening 13a of FIG. 4(c). The opening 13a and the opening 13b communicate with each other, so that the opening 13 of FIGS. 1 and 3 is formed. Further, portions of the support layer 10a that remain in the insulating layer 41 become the insular portions 25a, 26a. Each of the insular portions 25a, 26a has a land portion and a straight line portion. The land portions of the insular portions 25a, 26a become the pattern connection portions PC of FIG. 3. The ends of the straight line portions of the insular portions 25a, 26a opposite to the land portions become the element connection portions EC of FIG. 3. The land portions of the insular portions 25a, 26a are respectively electrically connected to the heat-assisted wiring traces H1, H2 through the openings 41h (FIG. 4(a)) of the insulating layer 41.

Next, as shown in FIG. 6(a), the etching resists 18a, 18b are removed. Thereafter, as shown in FIG. 6(b), the metal layers 25b, 26b are formed to respectively cover part of the straight line portions of the insular portions 25a, 26a. The metal layers 25b, 26b have a thickness from 0.1 μm to 3 μm, for example. The metal layers 25b, 26b include nickel and gold (Au). In the present example, the nickel plating and the gold plating are sequentially formed at part of the straight line portions of the insular portions 25a, 26a as the metal layers 25b, 26b.

The connection terminal 25 is constituted by the insular portion 25a and the metal layer 25b, and the connection terminal 26 is constituted by the insular portion 26a and the metal layer 26b. Each of the connection terminals 25, 26 has the land portion LD and the straight line portion LN. Thus, the suspension board 1 is completed.

(4) Effects

In the connection terminal 25 of the suspension board 1 according to the present embodiment, the metal layer 25b is formed on the element connection portion EC of the insular portion 25a. In the connection terminal 26, the metal layer 26b is formed on the element connection portion EC of the insular portion 26a. The insular portions 25a, 26a are formed of a stainless steel, and the metal layers 25b, 26b are formed by gold plating having higher wettability than a stainless steel with respect to the molten solder.

In a case in which the terminals of the heat-assisted device at the lower surface of the head slider are connected to the connection terminals 25, 26 by solder, this configuration causes the molten solder applied to the metal layers 25b, 26b to rapidly spread on the metal layers 25b, 26b. Thereafter, the molten solder becomes difficult to spread at a boundary between the metal layers 25b, 26b and the insular portions 25a, 26a. Therefore, the molten solder is cooled by the natural radiation of heat, and is solidified before spreading to the pattern connection portion PC. Thus, the wetting and spreading of the molten solder can be blocked by the simple configuration.

Further, because the molten solder at each of the element connection portions EC is prevented from spreading to another region via the pattern connection portion PC, each of the connection terminals 25, 26 is prevented from electrically coming into contact with another unintended portion (the pattern connection portion PC of the adjacent connection terminal, for example) via solder. As a result, a decrease in reliability of the suspension board 1 due to the wetting and spreading of the molten solder can be inhibited.

Further, because the molten solder at each of the element connection portions EC is prevented from spreading to another region via the pattern connection portion PC, each of the pattern connection portions PC can be designed to be larger than each of the element connection portions EC of the connection terminals 25, 26. Therefore, electrically connecting the pattern connection portions PC to the heat-assisted wiring traces H1, H2 is easy. Thus, electrically connecting the heat-assisted wiring traces H1, H2 and the connection terminals 25, 26 while the heat-assisted wiring traces H1, H2 and the connection terminals 25, 26 are respectively formed on the one surface and the other surface of the insulating layer 41 is easy.

[2] Second Embodiment (1) Configuration of Connection Terminals

With regard to the suspension board 1 according to the second embodiment, difference from the suspension board 1 according to the first embodiment will be described. The configuration of the suspension board 1 according to the second embodiment is similar to the configuration of the suspension board 1 according to the first embodiment except for the configuration of the connection terminals 25, 26.

Figure 7:
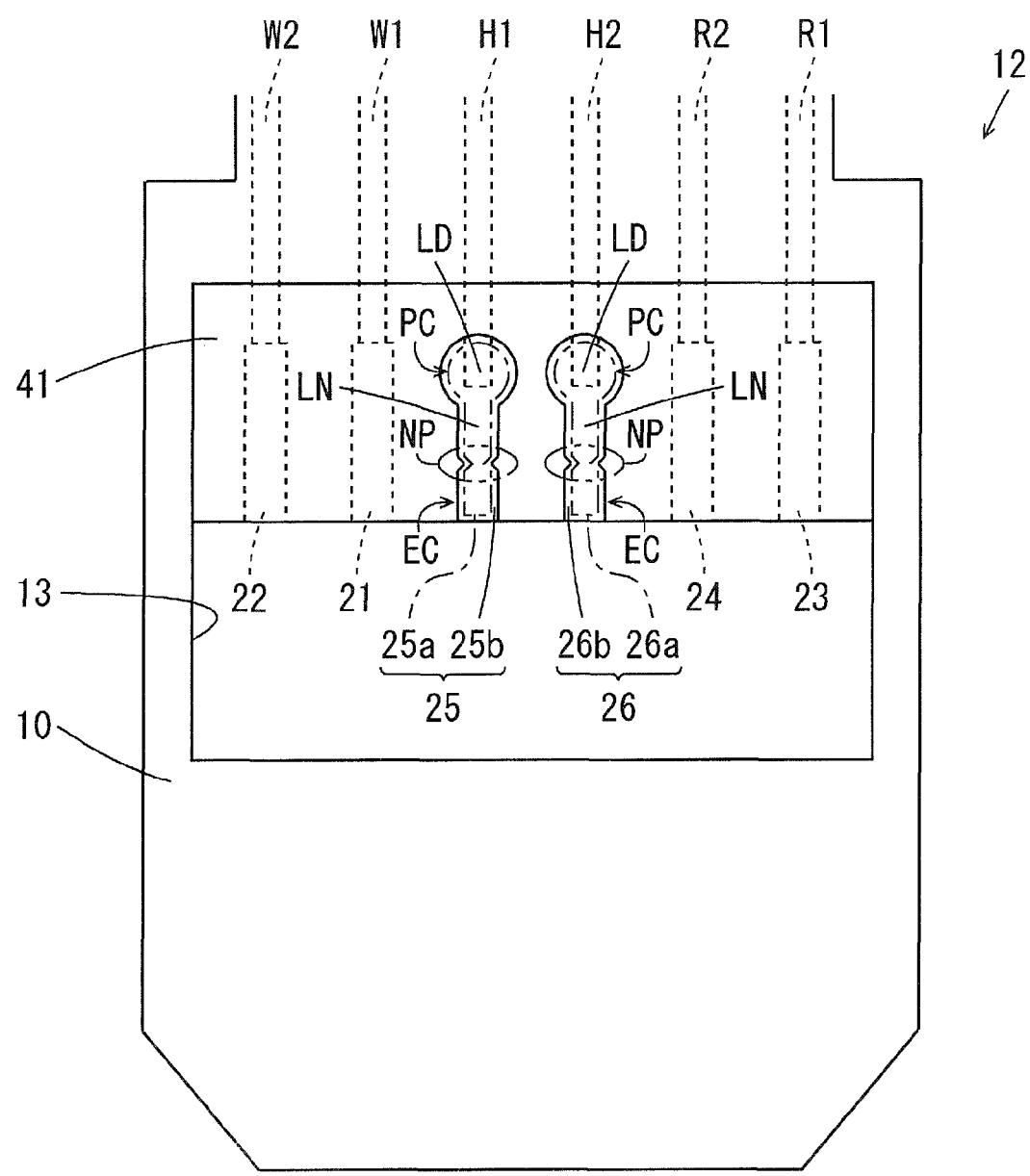
FIG. 7 is a bottom view of a tongue of the suspension board according to a second embodiment and its peripheral portions.

FIG. 7 is a bottom view of the tongue 12 of the suspension board 1 according to the second embodiment and its peripheral portions. As shown in FIG. 7, in the present embodiment, the metal layer 25b is formed to cover the entire land portion and the straight line portion of the insular portion 25a. Similarly, the metal layer 26b is formed to cover the entire land portion and the straight line portion of the insular portion 26a.

Each of the connection terminals 25, 26 has a narrow portion NP formed between the pattern connection portion PC and the element connection portion EC to be narrower than the element connection portion EC. In the example of FIG. 7, cutouts in a V-shape are formed at both lateral sides of each of the straight line portions of the connection terminals 25, 26, whereby the narrow portion NP is formed.

Figure 8:
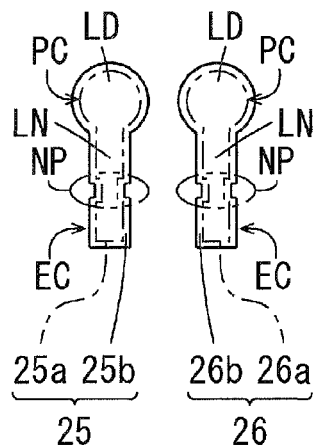
FIGS. 8(a) and 8(b) are bottom views of a connection terminal in another example of the second embodiment.
Figure 8:
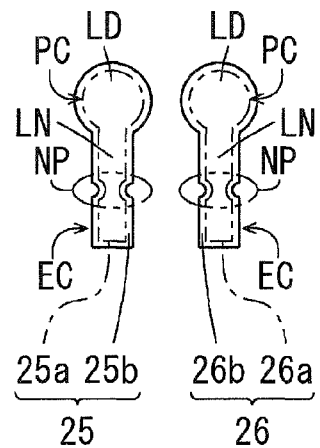

FIGS. 8(a) and 8(b) are bottom views of the connection terminals 25, 26 in another example of the second embodiment. In the example of FIG. 8(a), rectangular cutouts are formed at both lateral sides of each of the straight line portions of the connection terminals 25, 26, whereby the narrow portion NP is formed. In the example of FIG. 8(b), semicircular cutouts are formed at both lateral sides of each of the straight line portions of the connection terminals 25, 26, whereby the narrow portion NP is formed. In this manner, cutouts in any shape are formed at both lateral sides of each of the straight line portions of the connection terminals 25, 26, whereby the narrow portion NP is formed.

Figure 9:
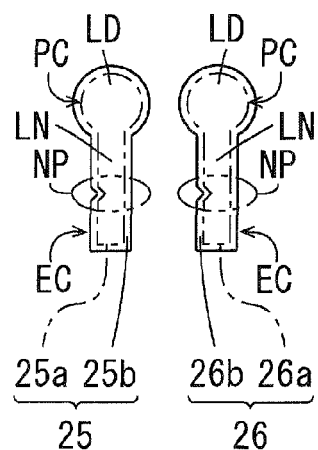
FIGS. 9(a) to 9(c) are bottom views of the connection terminal in yet another example of the second embodiment.
Figure 9:
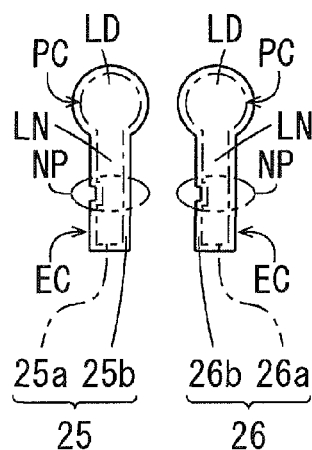
Figure 9:
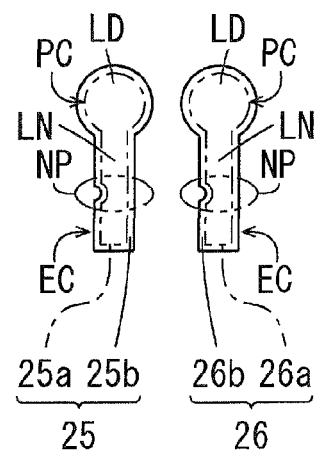

FIGS. 9(a) to 9(c) are bottom views of the connection terminals 25, 26 in yet another example of the second embodiment. In the example of FIG. 9(a), a cutout in a V-shape is formed at one lateral side of each of the straight line portions of the connection terminals 25, 26, so that the narrow portion NP is formed. In the example of FIG. 9(b), a rectangular cutout is formed at one lateral side of each of the straight line portions of the connection terminals 25, 26, so that the narrow portion NP is formed. In the example of FIG. 9(c), a semicircular cutout is formed at one lateral side of each of the straight line portions of the connection terminals 25, 26, so that the narrow portion NP is formed. In this manner, a cutout in any shape is formed at one lateral side of each of the straight line portions of the connection terminals 25, 26, so that the narrow portion NP may be formed.

(2) Manufacturing Method of Suspension Board

The method of manufacturing the suspension board 1 according to the present embodiment is similar to the method of manufacturing the suspension board 1 in the first embodiment except for the following points.

In the step of FIG. 5(b), a cutout that corresponds to the narrow portion NP of each of the connection terminals 25, 26 of FIGS. 7 to 9(c) is formed at both or one lateral side of the straight line portion of each etching resist 18b. Thus, in the step of FIG. 5(c), the insular portions 25a, 26a are formed.

Further, in the step of FIG. 6(b), the metal layers 25b, 26b are formed to respectively cover the entire insular portions 25a, 26a. The narrow portion NP of FIGS. 7 to 9(c) is formed at each of the metal layers 25b, 26b on each of the straight line portions of the insular portions 25a, 26a. Thus, the suspension board 1 is completed.

(3) Effects

In the suspension board 1 according to the present embodiment, the narrow portions NP of the connection terminals 25, 26 have a width smaller than the width of the element connection portions EC and the width of the pattern connection portions PC. Therefore, the spreading rate of the molten solder on the narrow portion NP is lower than the spreading rate of the molten solder on the element connection portion EC.

In this case, the molten solder applied to each of the element connection portions EC of the connection terminals 25, 26 stays around the narrow portion NP. Thus, the molten solder is cooled by the natural radiation of heat, and is solidified before spreading to each pattern connection portion PC. Further, because the width of each pattern connection portion PC is larger than the width of each narrow portion NP, even if the molten solder spreads to the pattern connection portion PC, the molten solder is solidified before spreading outside of the pattern connection portion PC. As a result, the wetting and spreading of the molten solder can be blocked by the simple configuration.

[3] Third Embodiment (1) Configuration of Connection Terminals

With regard to the suspension board 1 according to the third embodiment, difference from the suspension board 1 according to the first embodiment will be described. The configuration of the suspension board 1 according to the third embodiment is similar to the configuration of the suspension board 1 according to the first embodiment except for the configuration of the connection terminals 25, 26.

Figure 10:
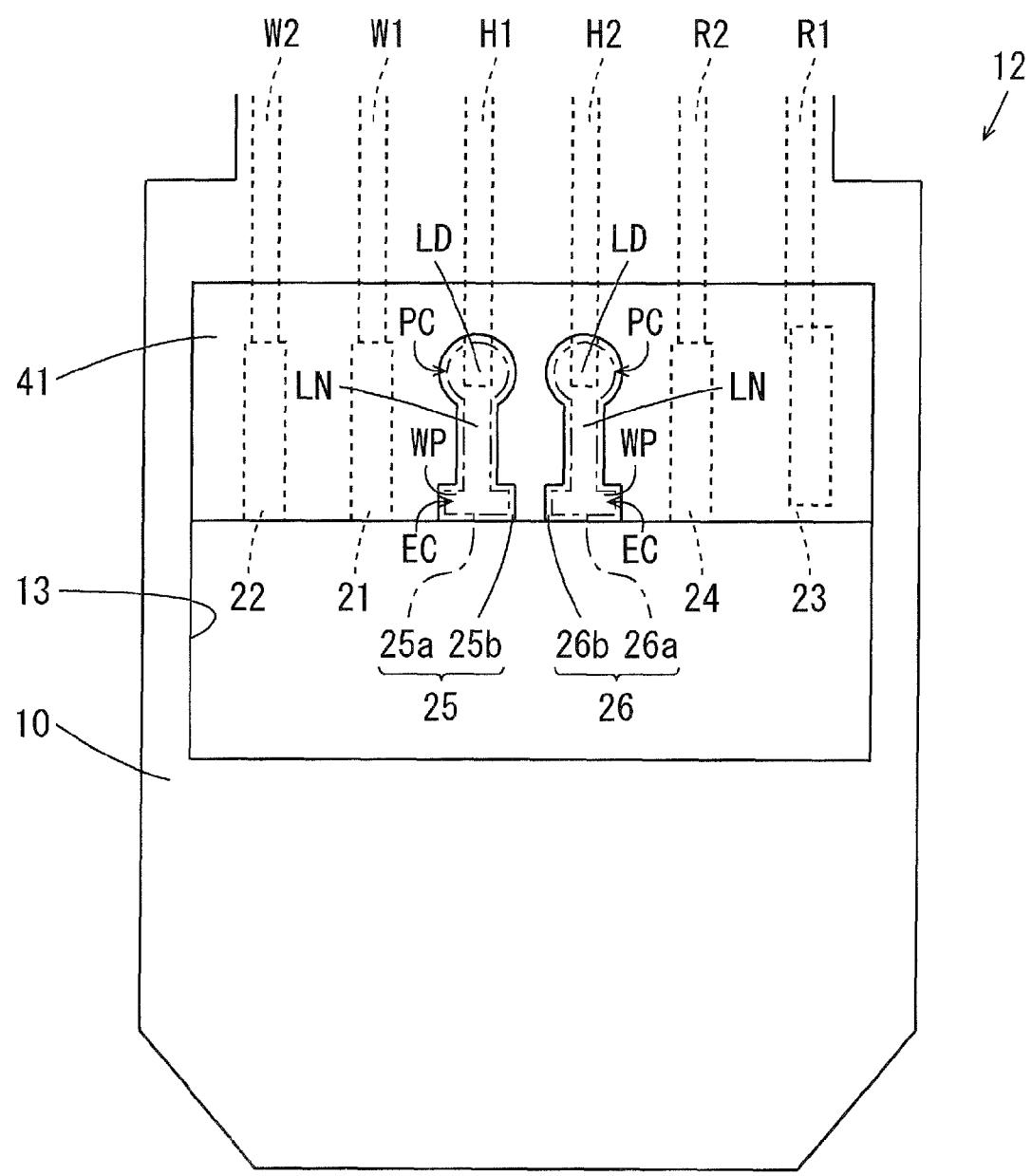
FIG. 10 is a bottom view of the tongue of the suspension board according to a third embodiment and its peripheral portions.

FIG. 10 is a bottom view of the tongue 12 of the suspension board 1 according to the third embodiment and its peripheral portions. As shown in FIG. 10, in the present embodiment, each of the insular portions 25a, 26a has a wide portion at the end of each of the straight line portions opposite to the land portion. The metal layer 25b is formed to cover the entire land portion, the straight line portion and the wide portion of the insular portion 25a. Similarly, the metal layer 26b is formed to cover the entire insular portion 26a. Thus, each of the connection terminals 25, 26 has the land portion LD, the straight line portion LN and the wide portion WP. The wide portions WP of the connection terminals 25, 26 have a width larger than the width of the straight line portions LN of the connection terminals 25, 26

Each of the wide portions WP of the connection terminals 25, 26 corresponds to the element connection portion EC. While the width of each of the element connection portions EC of the connection terminals 25, 26 is formed to be substantially equal to the width of each of the pattern connection portions PC in the example of FIG. 10, the invention is not limited to this. The width of each of the element connection portions EC of the connection terminals 25, 26 may be formed to be larger or smaller than the width of each of the pattern connection portions PC.

(2) Manufacturing Method of Suspension Board

The method of manufacturing the suspension board 1 according to the present embodiment is similar to the method of manufacturing the suspension board 1 in the first embodiment except for the following points.

In the step of FIG. 5(b), each etching resist 18b is formed into a shape that corresponds to each of the insular portions 25a, 26a of FIG. 10. Thus, in the step of FIG. 5(c), the insular portions 25a, 26a are formed. Each of the insular portions 25a, 26a has the land portion, the straight line portion and the wide portion.

Thereafter, in the step of FIG. 6(b), the metal layers 25b, 26b are formed to respectively cover the entire land portions, the straight line portions and the wide portions of the insular portions 25a, 26a. Thus, the suspension board 1 is completed.

(3) Effects

In the suspension board 1 according to the present embodiment, the wide portion WP has a width larger than the width of a portion between the wide portion WP and the pattern connection portion PC. Therefore, the heat dissipation of the wide portion WP is higher than the heat dissipation of the portion between the wide portion WP and the pattern connection portion PC. In this case, the molten solder applied to the wide portions WP of the connection terminals 25, 26 is cooled by the natural radiation of heat, and is solidified before spreading to the pattern connection portions PC. As a result, the wetting and spreading of the molten solder can be blocked by the simple configuration.

[4] Fourth Embodiment (1) Configuration of Connection Terminals

With regard to the suspension board 1 according to the fourth embodiment, difference from the suspension board 1 according to the first embodiment will be described. The configuration of the suspension board 1 according to the fourth embodiment is similar to the configuration of the suspension board 1 according to the first embodiment except for the configuration of the connection terminals 25, 26.

Figure 11:
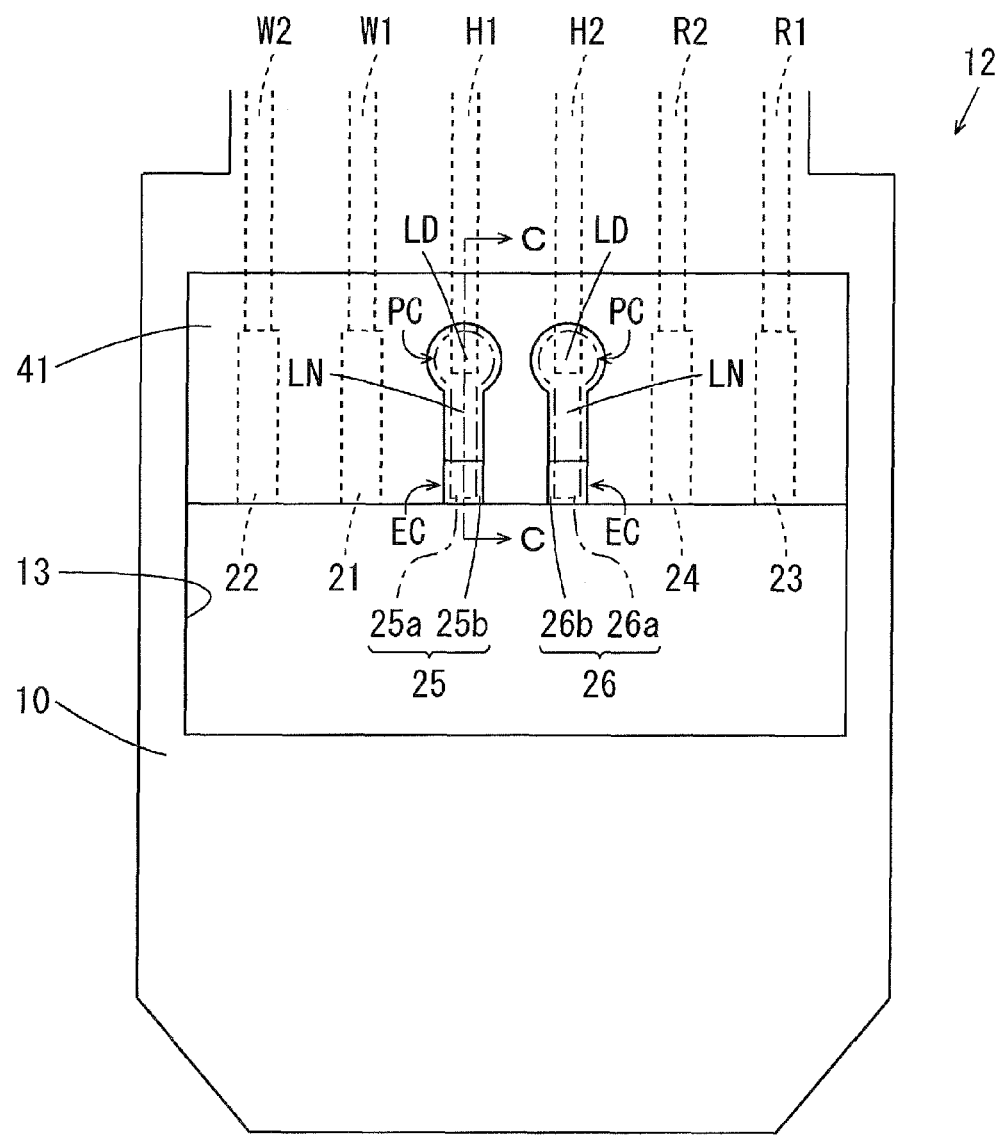
FIG. 11 is a bottom view of the tongue of the suspension board according to a fourth embodiment and its peripheral portions.
Figure 12:
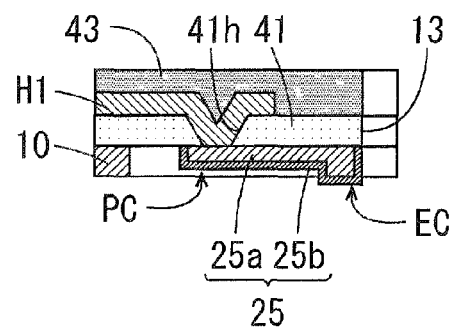
FIG. 12 is a cross sectional view taken along the line C-C of FIG. 11.

FIG. 11 is a bottom view of the tongue 12 of the suspension board 1 according to the fourth embodiment and its peripheral portions. FIG. 12 is a cross sectional view taken along the line C-C of FIG. 11. As shown in FIG. 11, in the present embodiment, the metal layer 25b is formed to cover the entire land portion and the straight line portion of the insular portion 25a. Similarly, the metal layer 26b is formed to cover the entire land portion and the straight line portion of the insular portion 26a.

In each of the connection terminals 25, 26 of the present embodiment, the end of the straight line portion LN opposite the land portion LD corresponds to the element connection portion EC. As shown in FIG. 12, the thickness of the element connection portion EC of the connection terminal 25 is formed to be larger than the thickness of the remaining portions of the connection terminal 25. Similarly, the thickness of the element connection portion EC of the connection terminal 26 is formed to be larger than the thickness of the remaining portions of the connection terminal 26.

Figure 13:
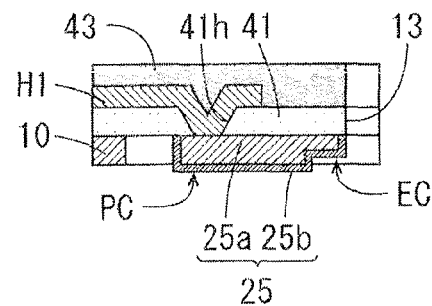
FIG. 13 is a cross sectional view of the suspension board according to another example of the fourth embodiment.

FIG. 13 is a cross sectional view of the suspension board 1 according to another example of the fourth embodiment. FIG. 13 corresponds to a cross sectional view taken along the line C-C of FIG. 11. In the example of FIG. 13, the thickness of the element connection portion EC of the connection terminal 25 is formed to be smaller than the thickness of the remaining portions of the connection terminal 25. Similarly, the thickness of the element connection portion EC of the connection terminal 26 is formed to be smaller than the thickness of the remaining portions of the connection terminal 26. In this manner, the thickness of the element connection portions EC of the connection terminals 25, 26 may be formed to be larger or smaller than the thickness of the remaining portions of the connection terminals 25, 26.

(2) Manufacturing Method of Suspension Board

The method of manufacturing the suspension board 1 in the present embodiment is similar to the method of manufacturing the suspension board 1 in the first embodiment except for the following points.

Figure 6:
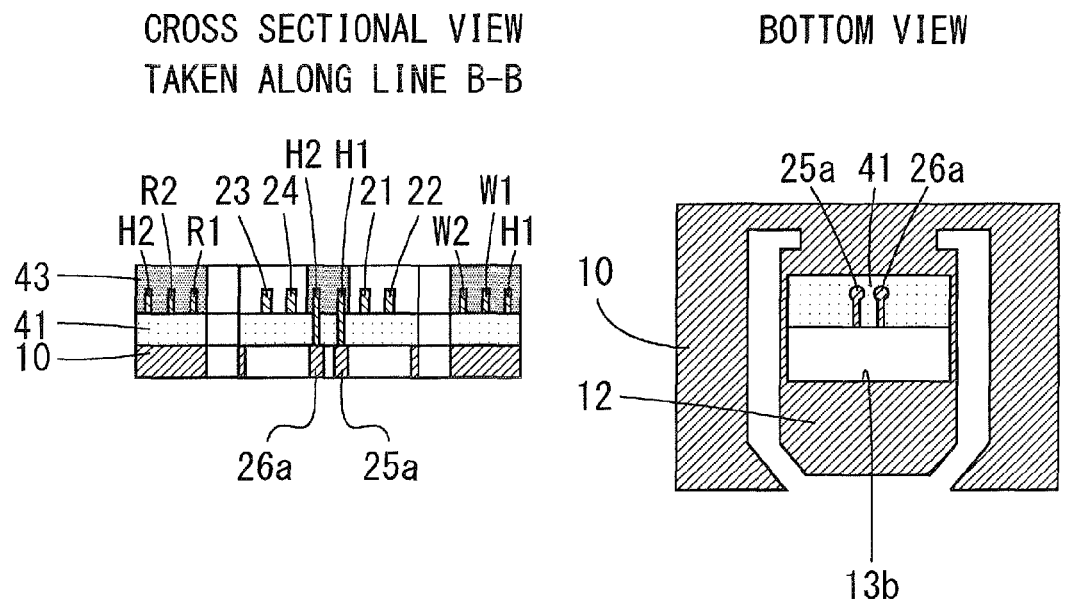
FIGS. 6(a) and 6(b) are schematic diagrams showing the manufacturing steps of the suspension board of FIG. 1.
Figure 6:
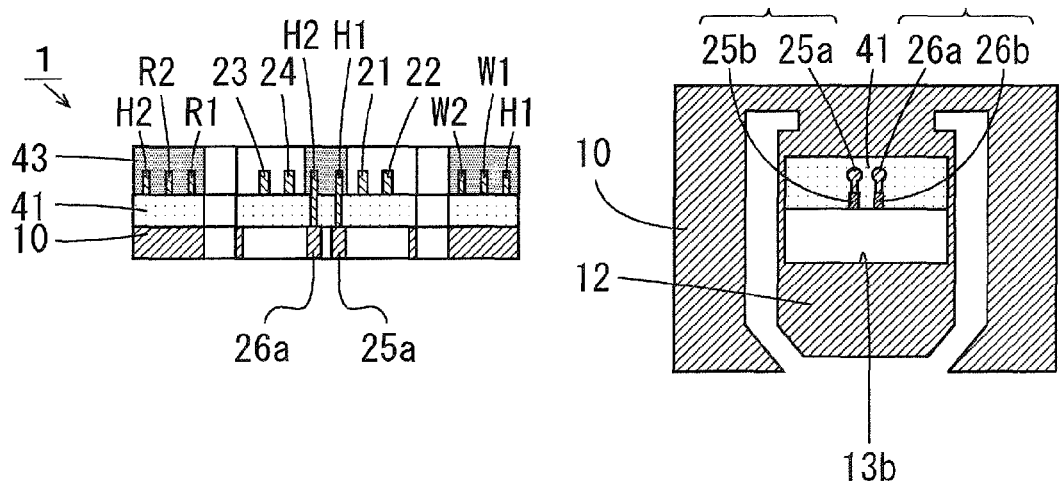

After the step of FIG. 6(*a*), the etching resist is formed at part of the insular portions 25*a*, 26*a*, and portions of the insular portions 25*a*, 26*a* exposed from the etching resist are half-etched using a ferric chloride solution and a cupric chloride solution as an etching liquid. Here, the end of the straight line portions opposite to the land portions may be half-etched. Alternatively, the straight line portions except for the ends of the straight line portions opposite to the land portions may be half-etched. The thickness of the half-etched portions of the insular portions 25*a*, 26*a* is smaller than the remaining portions of the insular portions 25*a*, 26*a*.

Thereafter, in the step of FIG. 6(*b*), the metal layers 25*b*, 26*b* are formed to respectively cover the entire land portions and the straight line portions of the insular portions 25*a*, 26*a*. Thus, the suspension board 1 is completed.

(3) Effects

In the suspension board 1 according to the present embodiment, the molten solder applied to the element connection portions EC of the connection terminals 25, 26 spreads on the element connection portions EC. Thereafter, the molten solder is cooled by the natural radiation of heat in spreading downward or upward along the edge of the element connection portions EC, and is solidified before spreading to the pattern connection portions PC. Thus, the wetting and spreading of the molten solder can be blocked by the simple configuration.

[5] Fifth Embodiment (1) Configuration of Connection Terminals

With regard to the suspension board 1 according to the fifth embodiment, difference from the suspension board 1 according to the first embodiment will be described. The configuration of the suspension board 1 according to the fifth embodiment is similar to the configuration of the suspension board 1 according to the first embodiment except for the configuration of the connection terminals 25, 26.

Figure 14:
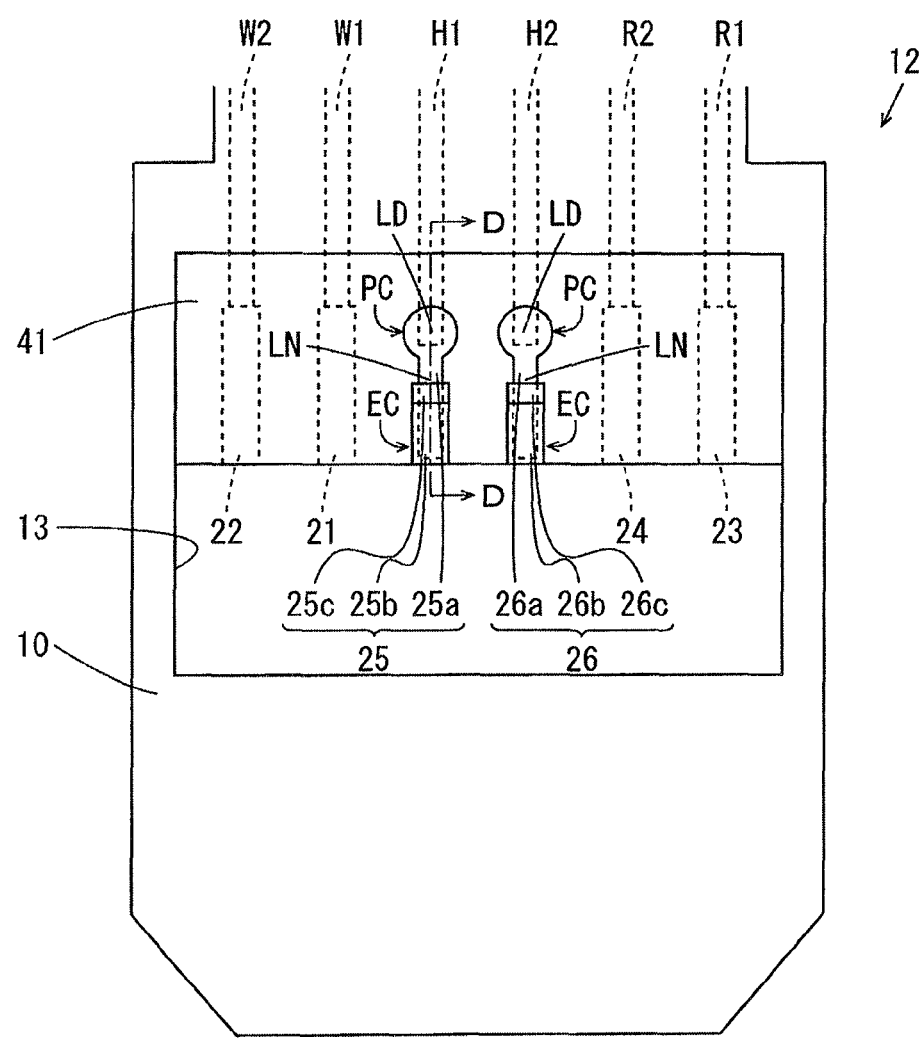
FIG. 14 is a bottom view of the tongue of the suspension board according to a fifth embodiment and its peripheral portions.
Figure 15:
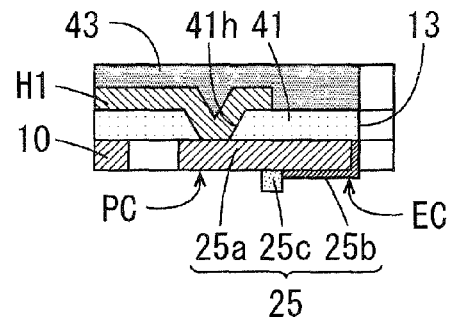
FIG. 15 is a cross sectional view taken along the line D-D of FIG. 14.

FIG. 14 is a bottom view of the tongue 12 of the suspension board 1 according to the fifth embodiment and its peripheral portions. FIG. 15 is a cross sectional view taken along the line D-D of FIG. 14. As shown in FIGS. 14 and 15, in the present embodiment, the connection terminal 25 further includes a resin layer 25*c*, and the connection terminal 26 further includes a resin layer 26*c*.

In the present embodiment, the resin layer 25*c* is provided to cover the straight line portion except for the end of the straight line portion opposite to the land portion of the insular portion 25*a*, and the resin layer 26*c* is provided to cover the straight line portion except for the end of the straight line portion opposite to the land portion of the insular portion 26*a*. The metal layer 25*b* is formed to cover the end of the straight line portion of the insular portion 25*a* exposed from the resin layer 25*c*, and the metal layer 26*b* is formed to cover the end of the straight line portion of the insular portion 26*a* exposed from the resin layer 26*c*.

As shown in FIG. 15, the resin layer 25*c* on the insular portion 25*a* has a thickness larger than the thickness of the metal layer 25*b* on the insular portion 25*a*. The metal layer 25*b* is not formed on the resin layer 25*c*. Similarly, the resin layer 26*c* on the insular portion 26*a* has a thickness larger than the thickness of the metal layer 26*b* on the insular portion 26*a*. The metal layer 26*b* is not formed on the resin layer 26*c*.

(2) Manufacturing Method of Suspension Board

The method of manufacturing the suspension board 1 in the present embodiment is similar to the method of manufacturing the suspension board 1 in the first embodiment except for the following points.

After the step of FIG. 6(*a*), the resin layer 25*c* is formed to cover the straight line portion except for the end of the straight line portion opposite to the land portion of the insular portion 25*a*, and the resin layer 26*c* is formed to cover the straight line portion except for the end of the straight line portion opposite to the land portion of the insular portion 26*a*. In the present example, the resin layers 25*c*, 26*c* are formed of polyimide.

The resin layers 25*c*, 26*c* on the insular portions 25*a*, 26*a* preferably have a thickness of not less than 2 µm and not more than 6 µm. Thus, the molten solder applied to the element connection portions EC of the connection terminals 25, 26 can be reliably prevented from going over the resin layers 25*c*, 26*c* and spreading to the pattern connection portions PC of the connection terminals 25, 26 while an increase in size of the suspension board 1 is inhibited.

Thereafter, in the step of FIG. 6(*b*), the metal layer 25*b* is formed to cover the end of the straight line portion of the insular portion 25*a* exposed from the resin layer 25*c*, and the metal layer 26*b* is formed to cover the end of the straight line portion of the insular portion 26*a* exposed from the resin layer 26*c*. Thus, the suspension board 1 is completed.

(3) Effects

In the suspension board 1 according to the present embodiment, the molten solder applied to the element connection portions EC of the connection terminals 25, 26 is blocked by the resin layers 25*c*, 26*c* after spreading on the element connection portions EC. Thus, the molten solder is solidified before spreading to the pattern connection portions PC. As a result, the wetting and spreading of the molten solder can be blocked by the simple configuration.

[6] Sixth Embodiment (1) Configuration of Connection Terminals

With regard to the suspension board 1 according to the sixth embodiment, difference from the suspension board 1 according to the first embodiment will be described. The configuration of the suspension board 1 according to the sixth embodiment is similar to the configuration of the suspension board 1 according to the first embodiment except for the configuration of the connection terminals 25, 26.

Figure 16:
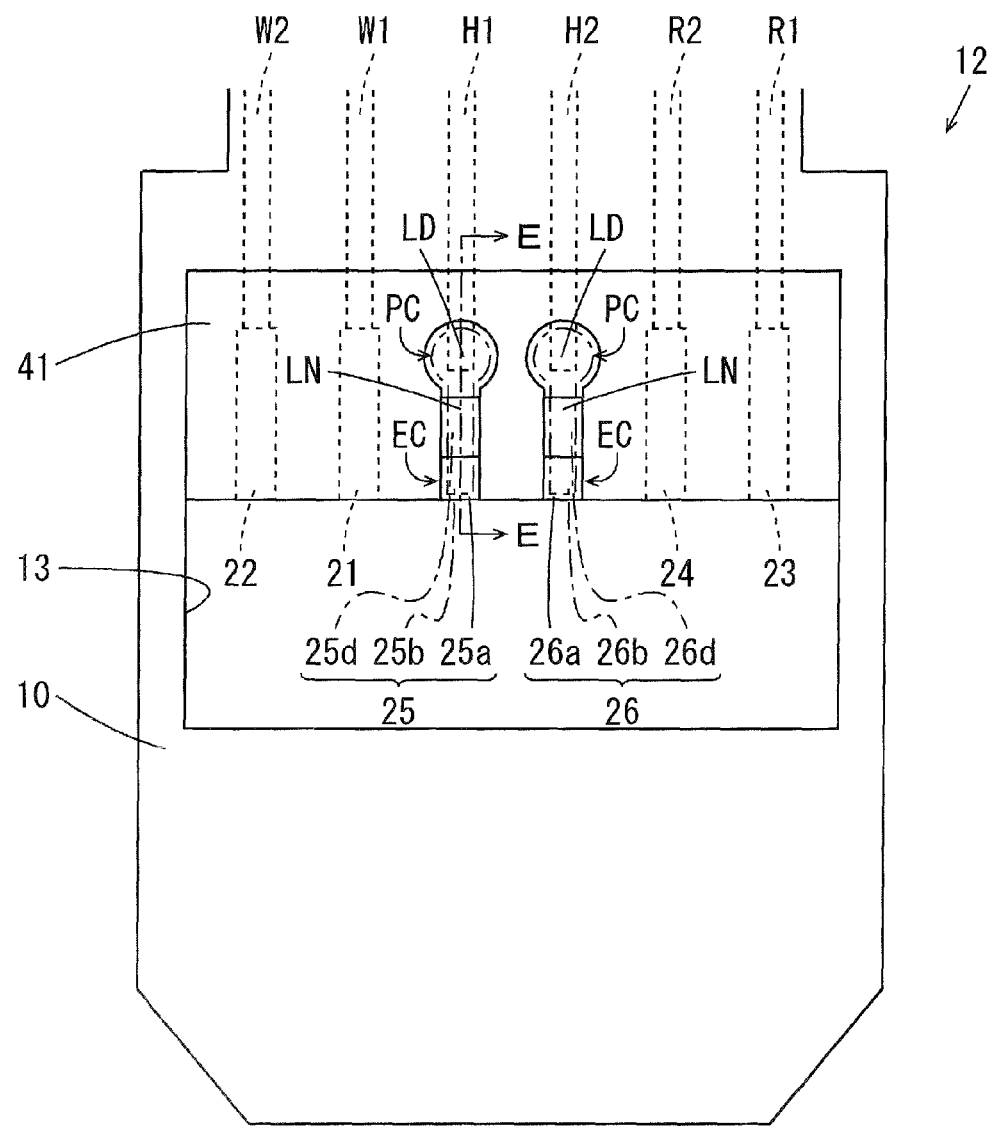
FIG. 16 is a bottom view of the tongue of the suspension board according to a sixth embodiment and its peripheral portions.
Figure 17:
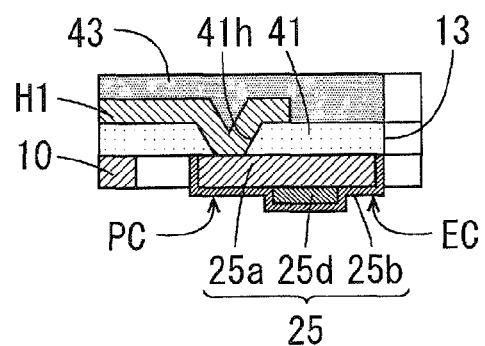
FIG. 17 is a cross sectional view taken along the line E-E of FIGS. 16.

FIG. 16 is a bottom view of the tongue 12 of the suspension board 1 according to the sixth embodiment and its peripheral portions. FIG. 17 is a cross sectional view taken along the line E-E of FIG. 16. As shown in FIGS. 16 and 17, in the present embodiment, the connection terminal 25 further includes the metal layer 25d, and the connection terminal 26 further includes the metal layer 26d.

The metal layer 25d is provided to cover the straight line portion except for the end of the straight line portion opposite to the land portion of the insular portion 25a, and the metal layer 26d is provided to cover the straight line portion except for the end of the straight line portion opposite to the land portion of the insular portion 26a. The metal layer 25b is formed to cover the entire insular portion 25a and the metal layer 25d, and the metal layer 26b is formed to cover the entire insular portion 26a and the metal layer 26d.

Figure 18:
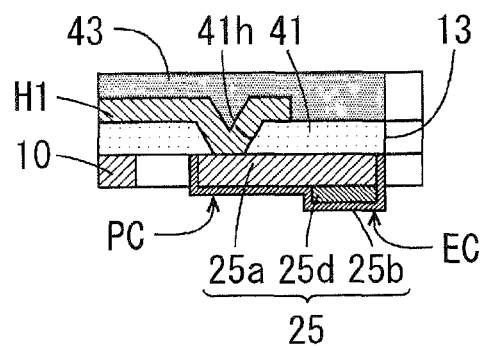
FIGS. 18(a) and 18(b) are cross sectional views of the suspension board according to another example of the sixth embodiment.
Figure 18:
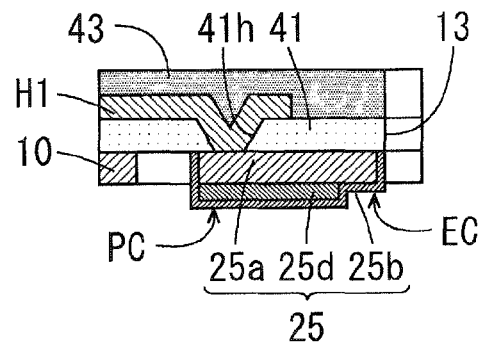

FIGS. 18(a) and 18(b) are cross sectional views of the suspension board 1 according to another example of the sixth embodiment. FIGS. 18(a) and 18(b) correspond to the cross sectional view taken along the line E-E of FIG. 16. In the example of FIG. 18(a), the metal layer 25d is formed at the end of the straight line portion opposite to the land portion of the insular portion 25a. Similarly, the metal layer 26d is formed at the end of the straight line portion opposite to the land portion of the insular portion 26a. The metal layer 25b is formed to cover the entire insular portion 25a and the metal layer 25d, and the metal layer 26b is formed to cover the entire insular portion 26a and the metal layer 26d.

In the example of FIG. 18(b), the metal layer 25d is formed at a portion except for the end of the straight line portion opposite to the land portion of the insular portion 25a. Similarly, the metal layer 26d is formed at a portion except for the end of the straight line portion opposite to the land portion of the insular portion 26a. The metal layer 25b is formed to cover the entire insular portion 25a and the metal layer 25d, and the metal layer 26b is formed to cover the insular portion 26a and the metal layer 26d.

(2) Manufacturing Method of Suspension Board

The method of manufacturing the suspension board 1 in the present embodiment is similar to the method of manufacturing the suspension board 1 in the first embodiment except for the following points.

After the step of FIG. 6(a), the metal layer 25d is formed to cover part of the insular portion 25a, and the metal layer 26d is formed to cover part of the insular portion 26a. In the present example, the metal layers 25d, 26d are formed of copper.

Thereafter, in the step of FIG. 6(b), the metal layer 25b is formed to cover the entire insular portion 25a and the metal layer 25d, and the metal layer 25b is formed to cover the entire insular portion 26a and the metal layer 26d. Thus, the suspension board 1 is completed.

(3) Effects

In the suspension board 1 according to the present embodiment, the molten solder applied to the element connection portions EC of the connection terminals 25, 26 is blocked by the metal layers 25d, 26d after spreading on the element connection portions EC. Alternatively, because the thermal dissipation of the metal layers 25d, 26d is high, the molten solder applied to the element connection portions EC of the connection terminals 25, 26 is cooled by the natural radiation of heat in spreading downward or upward along the edges of the metal layers 25d, 26d. Thus, the molten solder is solidified before spreading to the pattern connection portions PC. As a result, the wetting and spreading of the molten solder can be prevented by the simple configuration.

[7] Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

The suspension board 1 is an example of a suspension board with a circuit, the insulating layer 41 is an example of an insulating layer, the heat-assisted wiring traces H1, H2 are examples of a conductor layer and the support substrate 10 is an example of a support substrate. The connection terminals 25, 26 are examples of a connection terminal, the element connection portion EC is an example of a first portion, the pattern connection portion PC is an example of a second portion and the metal layers 25b, 26b are examples of a surface treatment layer. The narrow portion NP is an example of a narrow portion, the wide portion WP is an example of a wide portion, the resin layers 25c, 26c or the metal layers 25d, 26d are examples of a projection, the support layer 10a is an example of a support layer and a structure 1a is an example of a structure.

In the first embodiment, the metal layers 25b, 26b are examples of a spread blocking portion. In the second embodiment, the narrow portion NP is an example of a width changing portion and a spread blocking portion. In the third embodiment, a boundary between the straight line portion LN and the wide portion WP of each of the connection terminals 25, 26 are examples of a width changing portion and a spread blocking portion. In the fourth embodiment, a boundary between the element connection portion EC and the remaining portions of each of the connection terminals 25, 26 are examples of a thickness changing portion and a spread blocking portion. In the fifth embodiment, the resin layers 25c, 26c are examples of a thickness changing portion and a spread blocking portion. In the sixth embodiment, the metal layers 25d, 26d are examples of a thickness changing portion and a spread blocking portion.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for a printed circuit board, electric equipment or the like that has various connection terminals.

We claim:

1. A suspension board with a circuit to which a circuit element is connected by solder, comprising:
   an insulating layer having first and second surfaces;
   a conductor layer formed on the first surface of the insulating layer, the conductor layer including a pair of wiring traces which extend through the insulating layer from the first surface to the second surface;
   a conductive support substrate formed on the second surface of the insulating layer so as to be in contact with the second surface; and
   a pair of spaced-apart individual connection terminals formed on the second surface of the insulating layer, each connection terminal having a third surface and a fourth surface opposite to the third surface, the third surface being in contact with the second surface of the insulating layer and electrically connected to a respective wiring trace, each connection terminal being electrically insulated from the conductive support substrate, wherein each connection terminal has a first portion to which the solder is to be applied, a second portion to which the solder is not to be applied, and a spread blocking portion which, when the solder is applied to the first portion, blocks the solder applied to the first portion from spreading to the second portion, the fourth surface of each connection terminal having the first portion and the second portion.

2. The suspension board with a circuit according to claim 1, wherein
the spread blocking portion is a surface treatment layer formed on a surface of the first portion, and
a material for the surface treatment layer has a higher wettability than a material for a surface of the second portion with respect to molten solder.

3. The suspension board with a circuit according to claim 2, wherein
the first and second portions are formed of a stainless steel, and the surface treatment layer is formed by gold plating.

4. The suspension board with a circuit according to claim 1, wherein
each connection terminal has a width changing portion in which a width changes between the first portion and the second portion, and
the spread blocking portion is the width changing portion.

5. The suspension board with a circuit according to claim 4, wherein
the width changing portion has a narrow portion that has a width smaller than width of the first portion and width of the second portion.

6. The suspension board with a circuit according to claim 4, wherein
the first portion is made of a wide portion that has a width larger than width of the second portion, and
the width changing portion is a boundary between the wide portion and the second portion.

7. The suspension board with a circuit according to claim 1, wherein
each connection terminal has a thickness changing portion in which a thickness changes between the first portion and the second portion, and
the spread blocking portion is the thickness changing portion.

8. The suspension board with a circuit according to claim 7, wherein
the first portion has a thickness larger than the second portion, and the thickness changing portion is a boundary between the first portion and the second portion.

9. The suspension board with a circuit according to claim 7, wherein
the second portion has a thickness larger than the first portion, and the thickness changing portion is a boundary between the first portion and the second portion.

10. The suspension board with a circuit according to claim 7, wherein
the thickness changing portion is a projection provided along a boundary between the first portion and the second portion, and
the projection is formed to project from surfaces of the first and second portions.

11. The suspension board with a circuit according to claim 10, wherein the projection is formed of resin.

12. The suspension board with a circuit according to claim 10, wherein the projection is formed of metal.

13. The suspension board with a circuit according to claim 1, wherein the second portion of each connection terminal is formed to be exposed from the support substrate.

14. The suspension board with a circuit according to claim 1, wherein each connection terminal is formed to not overlap with the support substrate.

15. The suspension board with a circuit according to claim 1, wherein the first and second portions of each connection terminal are formed of a conductive material.

16. A suspension board with a circuit to which a circuit element is connected by solder, comprising:
an insulating layer having first and second surfaces;
a conductor layer formed on the first surface of the insulating layer, the conductor layer including a pair of wiring traces which extend through the insulating layer from the first surface to the second surface;
a conductive support substrate formed on the second surface of the insulating layer so as to be in contact with the second surface; and
a pair of spaced-apart individual connection terminals formed on the second surface of the insulating layer, each connection terminal having a third surface and a fourth surface opposite to the third surface, the third surface being in contact with the second surface of the insulating layer and electrically connected to a respective wiring trace, each connection terminal being electrically insulated from the conductive support substrate, wherein each connection terminal has first and second portions, and a spread blocking portion that blocks spreading of the solder applied to the first portion to the second portion, the spread blocking portion having an insular portion formed of a first material and a metal layer formed of a second material having higher wettability than the first material, the fourth surface of each connection terminal having the first portion and the second portion.

* * * * *